US011567485B2

(12) United States Patent
Terasawa et al.

(10) Patent No.: US 11,567,485 B2
(45) Date of Patent: Jan. 31, 2023

(54) SUBSTRATE PROCESSING SYSTEM AND METHOD FOR MONITORING PROCESS DATA

(71) Applicant: Tokyo Electron Limited, Tokyo (JP)

(72) Inventors: Nobutoshi Terasawa, Hokkaido (JP); Noriaki Koyama, Yamanashi (JP); Tomonori Yamashita, Hokkaido (JP); Takazumi Tanaka, Hokkaido (JP); Takehiro Kinoshita, Hokkaido (JP); Fumiaki Nagai, Hokkaido (JP); Eiji Kikama, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 189 days.

(21) Appl. No.: 16/919,992

(22) Filed: Jul. 2, 2020

(65) Prior Publication Data

US 2021/0011468 A1 Jan. 14, 2021

(30) Foreign Application Priority Data

Jul. 9, 2019 (JP) .............................. JP2019-127876

(51) Int. Cl.
| | |
|---|---|
| *H01L 21/67* | (2006.01) |
| *G05B 23/02* | (2006.01) |
| *G05B 19/418* | (2006.01) |
| *G06F 17/18* | (2006.01) |

(52) U.S. Cl.
CPC ..... *G05B 23/0205* (2013.01); *G05B 19/4184* (2013.01); *G06F 17/18* (2013.01); *H01L 21/67253* (2013.01); *G05B 2219/45031* (2013.01)

(58) Field of Classification Search
CPC .......................... H01L 21/00; H01L 21/67253
See application file for complete search history.

(56) References Cited

U.S. PATENT DOCUMENTS 9,581,996 B2 * 2/2017 Asai .................... G05B 23/0235
10,607,869 B2 * 3/2020 Takenaga .......... H01L 21/67313

FOREIGN PATENT DOCUMENTS

| JP | 2012-186213 A | 9/2012 |
| JP | 2012-216697 A | 11/2012 |

\* cited by examiner

*Primary Examiner* — Bryan Bui
(74) *Attorney, Agent, or Firm* — Venjuris, P.C.

(57) ABSTRACT

A substrate processing system includes: an acquiring unit configured to acquire process data of each step when each step included in a predetermined process is executed under different control conditions; an extracting unit configured to divide each step into a first section in which the process data fluctuates and a second section in which the process data is converged, and extract first data belonging to the first section and second data belonging to the second section from the process data; and a monitoring unit configured to monitor the process data by comparing one or both of an evaluation value that evaluates the first data and an evaluation value that evaluates the second data with corresponding upper and lower limit values.

9 Claims, 11 Drawing Sheets

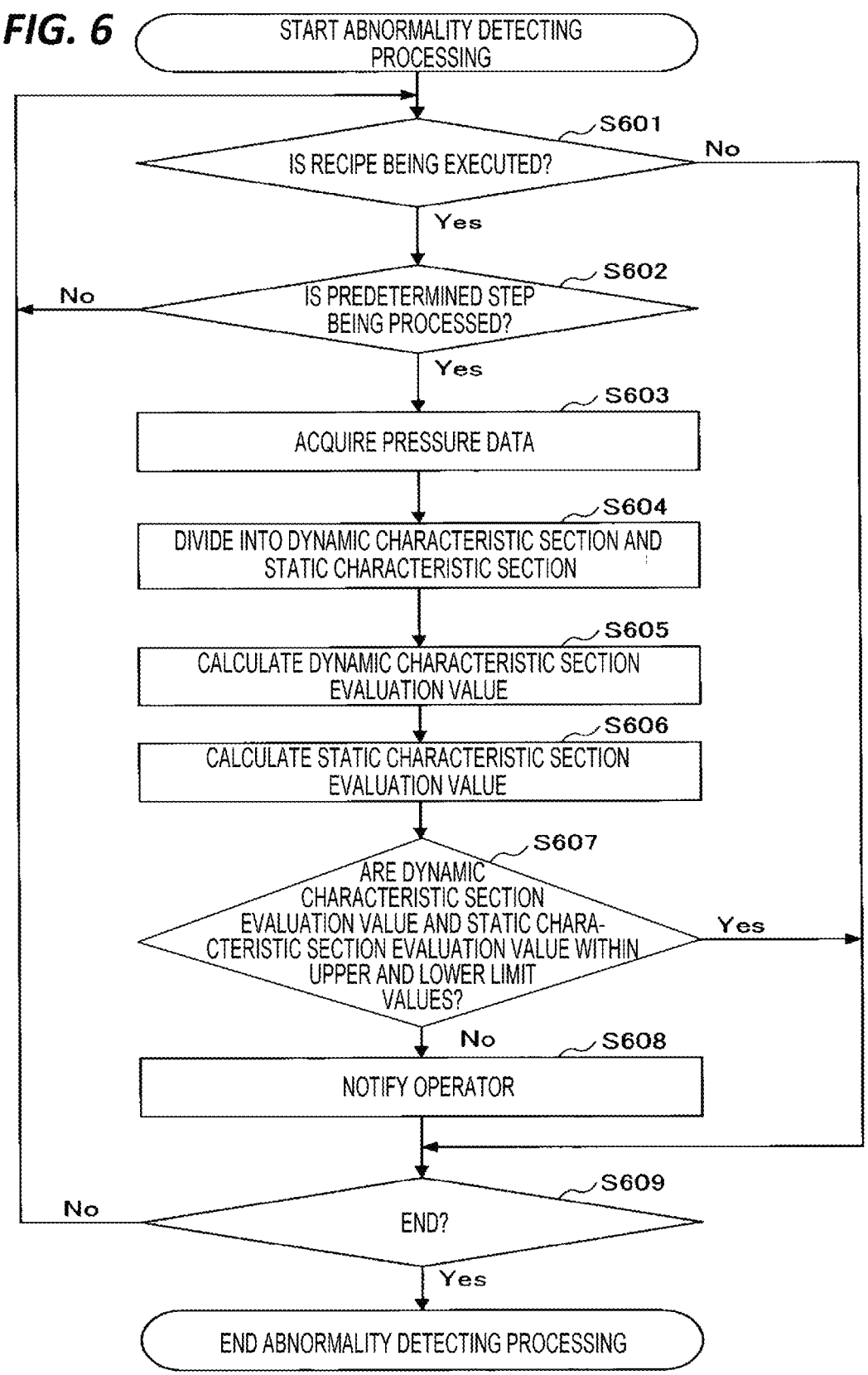

SUBSTRATE PROCESSING SYSTEM AND METHOD FOR MONITORING PROCESS DATA

CROSS-REFERENCE TO RELATED APPLICATIONS

This application is based on and claims priority from Japanese Patent Application No. 2019-127876 filed on Jul. 9, 2019 with the Japan Patent Office, the disclosure of which is incorporated herein in its entirety by reference.

TECHNICAL FIELD

The present disclosure relates to a substrate processing system and a method for monitoring process data.

BACKGROUND

Generally, in a substrate processing system such as a film forming system, when processing a substrate (a semiconductor wafer), a predetermined process is executed while controlling a gas pressure in a processing container to a target gas pressure. In the substrate processing system, an abnormality of the process data is detected by monitoring the process data (e.g., pressure data and flow rate data) acquired during the execution of the process.

Meanwhile, among the substrate processing system, in a film forming system executing a film forming process by an atomic layer deposition (ALD) method, a plurality of processes (ALD cycles) are executed for one substrate.

At this time, in the film forming system, in each step included in each of the ALD cycles, the ALD cycles are executed while controlling the gas pressure under different control conditions (while the conditions such as the target gas pressure or the flow rate of the supplied processing gas are different). As a result, the process data acquired by the film forming system during the execution of the ALD cycle exhibits different behavior for each step. See, for example, Japanese Patent Laid-Open Publication Nos. 2012-216697 and 2012-186213.

SUMMARY

A substrate processing system according to an aspect of the present disclosure includes: an acquiring unit configured to acquire process data of each step when each step included in a predetermined process is executed under different control conditions; an extracting unit configured to divide each step into a first section in which the process data fluctuates and a second section in which the process data is converged, and extract first data belonging to the first section and second data belonging to the second section from the process data; and a monitoring unit configured to monitor the process data by comparing one or both of an evaluation value that evaluates the first data and an evaluation value that evaluates the second data with corresponding upper and lower limit values.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a first flow chart illustrating a flow of the abnormality detecting processing by the abnormality detecting unit.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, details of each embodiment will be described with reference to accompanying drawings. In each of the following embodiments, a film forming system (a single-sheet type) executing a film forming process by the ALD method will be described as an example of a substrate processing system. However, the substrate processing system is not limited to the film forming system executing the film forming process by the ALD method, but may be, for example, a film forming system executing a film forming process by a chemical vapor deposition (CVD) method. Alternatively, the present disclosure may be applied to a substrate processing system executing a process other than a film forming process. Further, the substrate processing system is not limited to a single-sheet type, and may be a batch type. In that case, the substrate processing system may be a vertical furnace or a horizontal furnace.

Further, in each of the following embodiments, in the film forming process by the ALD method, pressure data will be described as an example of a process data to be monitored during execution of an ALD cycle. However, the process data monitored during the execution of the ALD cycle is not limited to the pressure data, but may be other process data such as flow rate data or temperature data.

Hereinafter, when describing each of the embodiments, components having substantially the same functional configurations will be denoted by the same symbols, and the overlapping descriptions thereof will be omitted.

First Embodiment (Configuration of Film Forming System)

Figure 1:
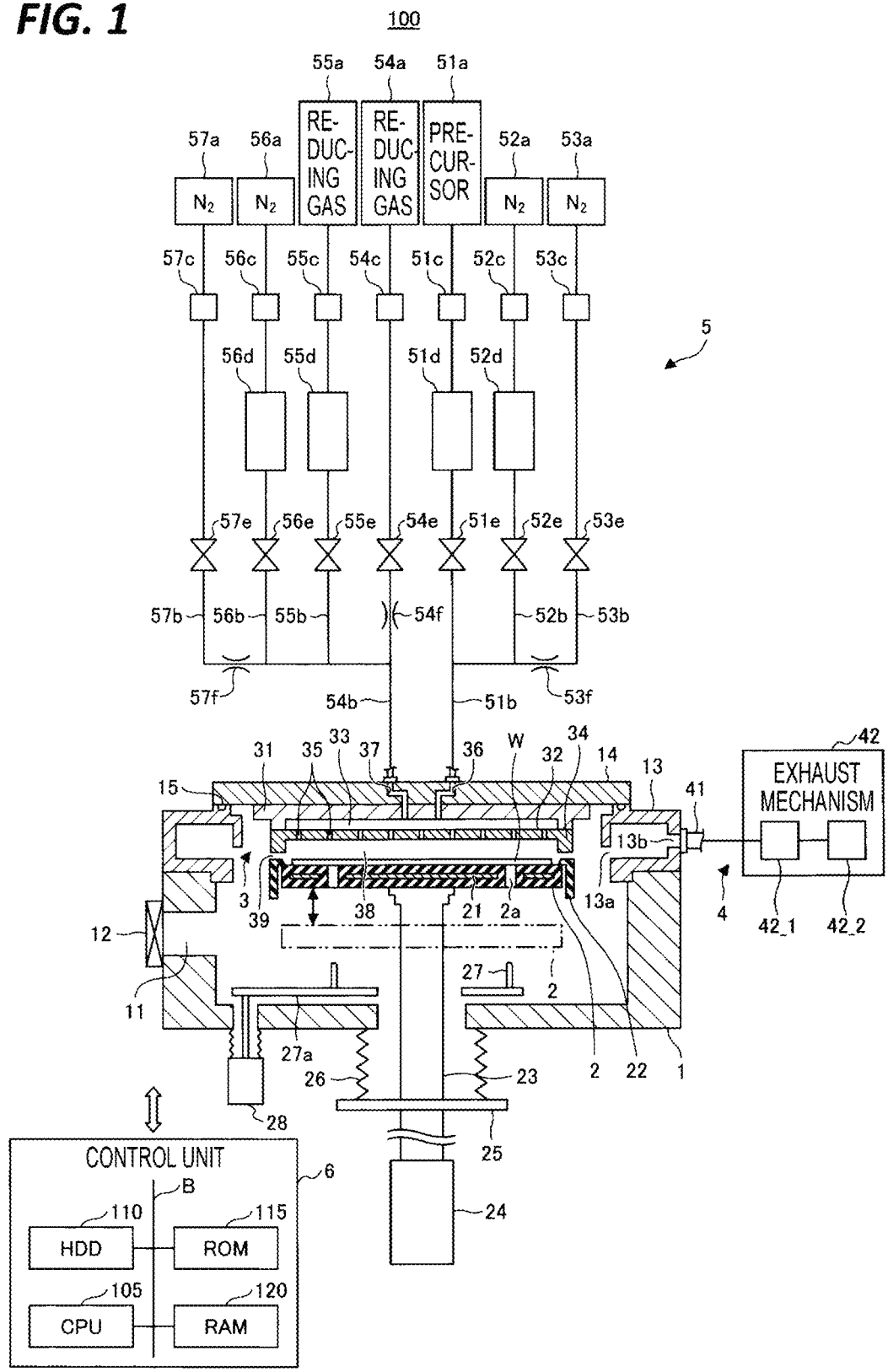
FIG. 1 is a view illustrating an example of a configuration of a film forming system.

First, descriptions will be made on an example of a configuration of a film forming system that executes a film forming process by the ALD method. FIG. 1 is a view illustrating an example of a configuration of the film forming system. As illustrated in FIG. 1, a film forming system 100 includes a processing container 1, a stage 2, a shower head 3, an exhaust unit 4, a gas supply mechanism 5, and a control unit 6.

The processing container 1 is made of a metal, for example, aluminum, and has a substantially cylindrical shape. The processing container 1 accommodates a semiconductor wafer (hereinafter, referred to as a "wafer W") which is a substrate. A carry-in/out port 11 configured to carry in or carry out the wafer W is formed in a side wall of the processing container 1. The carry-in/out port 11 is opened or closed by a gate valve 12. An annular exhaust duct 13 which has a rectangular cross-sectional shape is provided on a body of the processing container 1. A slit 13a is formed along an inner peripheral surface in the exhaust duct 13. An exhaust port 13b is formed in an outer wall of the exhaust duct 13. An upper wall 14 is provided on an upper surface of the exhaust duct 13 so as to close an upper opening of the processing container 1. A space between the exhaust duct 13 and the upper wall 14 is hermetically sealed with a seal ring 15.

The stage 2 horizontally supports the wafer W within the processing container 1. The stage 2 is formed in a disc shape having a size corresponding to the wafer W, and is supported by a support member 23. The stage 2 is made of a ceramic material, for example, aluminum nitride (AlN), or a metal material, for example, aluminum or a nickel alloy, and a heater 21 configured to heat the wafer W is embedded therein. The heater 21 generates heat by being supplied with power from a heater power source (not illustrated). Then, the wafer W is controlled to a predetermined temperature by controlling the output of the heater 21 according to a temperature signal of a thermocouple (not illustrated) provided on the vicinity of the upper surface of the stage 2. The stage 2 is provided with a cover member 22 made of a ceramics, for example, alumina so as to cover an outer peripheral area of the upper surface, and a side surface of the stage 2.

The support member 23 is provided on the bottom surface of the stage 2 to support the stage 2. The support member 23 penetrates a hole formed in the bottom wall of the processing container 1 from the center of the bottom surface of the stage 2 and extends downward of the processing container 1, and the lower end thereof is connected to a lifting mechanism 24. The stage 2 moves up and down between a processing position illustrated in FIG. 1 and a transfer position where the wafer W may be transferred illustrated by a chain double-dashed line below the processing position by the support member 23 with the lifting mechanism 24. A flange portion 25 is attached to the support member 23 below the processing container 1, and a bellows 26 is provided between the bottom surface of the processing container 1 and the flange portion 25 to partition an atmosphere in the processing container 1 from an outer air, and expand or contract according to an moving up and down operation of the stage 2.

Three wafer support pins 27 (only two are illustrated) are provided in the vicinity of the processing container 1 so as to protrude upward from a lifting plate 27a. The wafer support pins 27 move up and down by the lifting plate 27a with a lifting mechanism 28 provided below the processing container 1. The wafer support pins 27 are configured to be inserted and penetrate through holes 2a provided in the stage 2 in the transfer position so as to be able to protrude and retreat from the upper surface of the stage 2. By moving the wafer support pins 27 up and down, delivery of the wafer W between a transfer mechanism (not illustrated) and the stage 2 is performed.

The shower head 3 supplies the processing gas into the processing container 1 in a shower type. The shower head 3 is based on a metal, is provided so as to face the stage 2, and has a diameter substantially equal to that of the stage 2. The shower head 3 includes a body portion 31 fixed to the upper wall 14 of the processing container 1 and a shower plate 32 connected below the body portion 31. A gas diffusion space 33 is formed between the body portion 31 and the shower plate 32. Gas introducing holes 36 and 37 are formed in the gas diffusion space 33 so as to penetrate the center of the upper wall 14 of the processing container 1 and the body portion 31. An annular protrusion 34 protruding downward is formed in the circumferential edge of the shower plate 32.ABS ejecting holes 35 are formed on a flat surface inside the annular protrusion 34. In a state where the stage 2 is at the processing position, a processing space 38 is formed between the stage 2 and the shower plate 32, and the upper surface of the cover member 22 and the annular protrusion 34 come close to each other, thereby forming an annular gap 39.

The exhaust unit 4 exhausts the gas in the processing container 1. The exhaust unit 4 includes an exhaust pipe 41 connected to the exhaust port 13b and an exhaust mechanism 42 connected to the exhaust pipe 41. The gas in the processing container 1 reaches the exhaust duct 13 via the slit 13a, and is exhausted from the exhaust duct 13 through the exhaust pipe 41 by the exhaust mechanism 42. The exhaust mechanism 42 includes a pressure control device 42_1 and a vacuum pump 42_2.

The gas supply mechanism 5 supplies the processing gas into the processing container 1. The gas supply mechanism 5 includes a precursor supply source 51a, an $N_2$ gas supply source 52a, an $N_2$ gas supply source 53a, a reducing gas supply source 54a, a reducing gas supply source 55a, an $N_2$ gas supply source 56a, and an $N_2$ gas supply source 57a.

The precursor supply source 51a supplies a precursor, which is tungsten chloride gas, into the processing container 1 through a gas supply line 51b. The gas supply line 51b is provided with a flow rate control device 51c, a storage tank 51d, and a valve 51e from the upstream side. The downstream side of the valve 51e of the gas supply line 51b is connected to the gas introducing hole 36. The precursor supplied from the precursor supply source 51a is temporarily stored in the storage tank 51d before being supplied into the processing container 1, is pressurized to a predetermined pressure in the storage tank 51d, and then, is supplied into the processing container 1. The supply and the stop of the precursor from the storage tank 51d to the processing container 1 are performed by the valve 51e. By temporarily storing the precursor in the storage tank 51d described above, it is possible to stably supply the precursor into the processing container 1 at a relatively large flow rate.

The $N_2$ gas supply source 52a supplies $N_2$ gas, which is a purge gas, into the processing container 1 through a gas supply line 52b. The gas supply line 52b is provided with a flow rate control device 52c, a storage tank 52d, and a valve 52e from the upstream side. The downstream side of the valve 52e of the gas supply line 52b is connected to the gas supply line 51b. The $N_2$ gas supplied from the $N_2$ gas supply source 52a is temporarily stored in the storage tank 52d before being supplied into the processing container 1, is pressurized to a predetermined pressure in the storage tank 52d, and then, is supplied into the processing container 1. The supply and the stop of the $N_2$ gas from the storage tank 52d to the processing container 1 are performed by the valve 52e. By temporarily storing the $N_2$ gas in the storage tank 52d described above, it is possible to stably supply the $N_2$ gas into the processing container 1 at a relatively large flow rate.

The $N_2$ gas supply source 53a supplies $N_2$ gas, which is a carrier gas, into the processing container 1 through a gas supply line 53b. The gas supply line 53b is provided with a flow rate control device 53c, a valve 53e, and an orifice 53f from the upstream side. The downstream side of the orifice 53f of the gas supply line 53b is connected to the gas supply line 51b. The $N_2$ gas supplied from the $N_2$ gas supply source 53a is continuously supplied into the processing container 1 during the film formation of the wafer W. The supply and the stop of the $N_2$ gas from the $N_2$ gas supply source 53a to the processing container 1 are performed by the valve 53e. Although the gases are supplied to the supply lines 51b and 52b at a relatively large flow rate by the storage tanks 51d and 52d, the gases supplied to the gas supply lines 51b and 52b are prevented from flowing back to the $N_2$ gas supply line 53b by the orifice 53f.

The reducing gas supply source 54a supplies a reducing gas into the processing container 1 through a reducing gas supply line 54b. The reducing gas supply line 54b is provided with a flow rate control device 54c, a valve 54e, and an orifice 54f from the upstream side. The downstream side of the orifice 54f of the reducing gas supply line 54b is connected to the gas introducing hole 37. The reducing gas supplied from the reducing gas supply source 54a is continuously supplied into the processing container 1 during the film formation of the wafer W. The supply and the stop of the reducing gas from the reducing gas supply source 54a to the processing container 1 are performed by the valve 54e. Although the gases are supplied to supply lines 55b and 56b at a relatively large flow rate by storage tanks 55d and 56d (to be described later), the gases supplied to the gas supply lines 55b and 56b are prevented from flowing back to the reducing gas supply line 54b by the orifice 54f.

The reducing gas supply source 55a supplies a reducing gas into the processing container 1 through the reducing gas supply line 55b. The gas supply line 55b is provided with a flow rate control device 55c, the storage tank 55d, and a valve 55e from the upstream side. The downstream side of the valve 55e of the gas supply line 55b is connected to the reducing gas supply line 54b. The reducing gas supplied from the reducing gas supply source 55a is temporarily stored in the storage tank 55d before being supplied into the processing container 1, is pressurized to a predetermined pressure in the storage tank 55d, and then, is supplied into the processing container 1. The supply and the stop of the reducing gas from the storage tank 55d to the processing container 1 are performed by the valve 55e. By temporarily storing the reducing gas in the storage tank 55d described above, it is possible to stably supply the reducing gas into the processing container 1 at a relatively large flow rate.

The $N_2$ gas supply source 56a supplies $N_2$ gas, which is a purge gas, into the processing container 1 through the gas supply line 56b. The gas supply line 56b is provided with a flow rate control device 56c, the storage tank 56d, and a valve 56e from the upstream side. The downstream side of the valve 56e of the gas supply line 56b is connected to the reducing gas supply line 54b. The $N_2$ gas supplied from the $N_2$ gas supply source 56a is temporarily stored in the storage tank 56d before being supplied into the processing container 1, is pressurized to a predetermined pressure in the storage tank 56d, and then, is supplied into the processing container 1. The supply and the stop of the $N_2$ gas from the storage tank 56d to the processing container 1 are performed by the valve 56e. By temporarily storing the $N_2$ gas in the storage tank 56d described above, it is possible to stably supply the $N_2$ gas into the processing container 1 at a relatively large flow rate.

The $N_2$ gas supply source 57a supplies $N_2$ gas, which is a carrier gas, into the processing container 1 through a gas supply line 57b. The gas supply line 57b is provided with a flow rate control device 57c, a valve 57e, and an orifice 57f from the upstream side. The downstream side of the orifice 57f of the gas supply line 57b is connected to the gas supply line 54b. The $N_2$ gas supplied from the $N_2$ gas supply source 57a is continuously supplied into the processing container 1 during the film formation of the wafer W. The supply and the stop of the $N_2$ gas from the $N_2$ gas supply source 57a to the processing container 1 are performed by the valve 57e. Although the gases are supplied to the supply lines 55b and 56b at a relatively large flow rate by the storage tanks 55d and 56d, the gases supplied to the gas supply lines 55b and 56b are prevented from flowing back to the $N_2$ gas supply line 57b by the orifice 57f.

The control unit 6 includes a central processing unit (CPU) 105, a hard disk drive (HDD) 110, a read only memory (ROM) 115, and a random access memory (RAM) 120. The CPU 105, the HDD 110, the ROM 115, and the RAM 120 are connected to each other via a bus B.

The control unit 6 functions as a generating unit that generates a recipe (a recipe including a plurality of ALD cycles) when executing the film forming process by the ALD method. Further, the control unit 6 functions as a setting unit that sets the generated recipe in the HDD 110 or the RAM 120. Further, the control unit 6 functions as an executing unit by executing the plurality of ALD cycles included in the set recipe.

(Example of Functional Configuration of Controller of Pressure Control Device and Recipe)

Next, descriptions will be made on details of the pressure control device 42_1 included in the exhaust mechanism 42. The pressure control device 42_1 includes an operation terminal (e.g., a pressure control valve), a pressure sensor, and a controller that outputs control data according to a deviation between the pressure data measured by the pressure sensor and a target gas pressure (a target value). Here, descriptions will be mainly made on the functional configuration of the controller and the recipe referred to when the controller operates.

Figure 2:
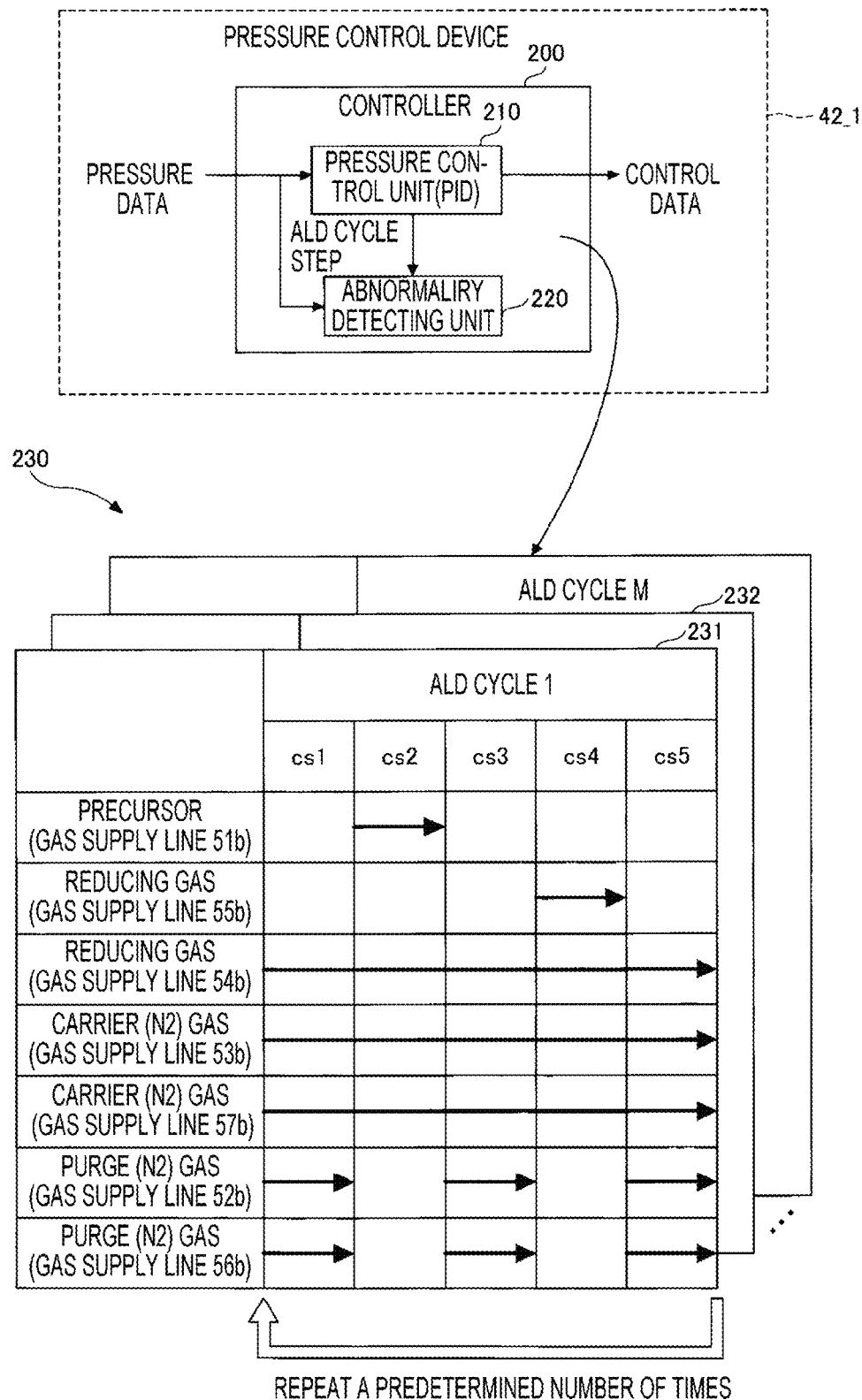
FIG. 2 is a view illustrating an example of a functional configuration of a controller of a pressure control device and an example of a recipe when executing a film forming process by an ALD method.

FIG. 2 is a view illustrating an example of the functional configuration of the controller of the pressure control device and an example of the recipe when executing the film forming process by the ALD method.

A pressure control program is installed in the controller 200, and the controller 200 functions as a pressure control unit 210 and an abnormality detecting unit 220 by executing the program.

The pressure control unit 210 acquires pressure data measured by a pressure sensor (not illustrated) included in the pressure control device 42_1, and outputs control data according to the deviation from the target gas pressure.

Therefore, the operation terminal (e.g., a pressure control valve) included in the pressure control device 42_1 is controlled, and the gas pressure in the processing container 1 is controlled to the target gas pressure.

The target gas pressure is defined for each cycle step (cs) included in each ALD cycle of the recipe 230. Further, for example, a PID control is used to control the gas pressure by the pressure control unit 210.

The abnormality detecting unit 220 acquires the pressure data measured by the pressure sensor included in the pressure control device 42_1, and detects abnormality of the pressure data by monitoring the acquired pressure data for each cycle step (cs) included in each ALD cycle of the recipe 230.

In FIG. 2, the recipe 230 is set in the control unit 6 when executing the film forming process by the ALD method. Hereinafter, descriptions will be briefly made on the operation (mainly the operation on the gas supply mechanism 5 side) of the film forming system 100 when executing the film forming process by the ALD method with reference to the film forming system 100 in FIG. 1 and the recipe 230 in FIG. 2.

(Operation of Film Forming System)

In the film forming system 100, before executing an ALD cycle 1 (reference numeral 231), firstly, with the valves 51e to 57e closed, the gate valve 12 is opened to transfer the wafer W into the processing container 1 by the transfer mechanism, and placed on the stage 2 in the transfer position. Further, in the film forming system 100, after retracting the transfer mechanism from the precessing container 1, the gate valve 12 is closed. Further, in the film forming system 100, the wafer W is heated to a predetermined temperature (e.g., 450° C. to 650° C.) by the heater 21 of the stage 2, and the stage 2 is raised to the processing position to form the processing space 38. Further, in the film forming system 100, the inside of the processing container 1 is adjusted a predetermined pressure (e.g., $1.3 \times 10^3$ Pa to $8.0 \times 10^3$ Pa) by the pressure control valve of the exhaust mechanism 42.

Subsequently, in the film forming system 100, the ALD cycle 1 (reference numeral 231) is executed. Specifically, in the film forming system 100, in a cycle step cs1, the valves 53e and 57e are opened, and the carrier gas ($N_2$ gas) at a predetermined flow rate (e.g., 100 sccm to 3,000 sccm) is supplied from the $N_2$ gas supply sources 53a and 57a to the gas supply lines 53b and 57b, respectively. Further, in the film forming system 100, in the cycle step cs1, the valve 54e is opened, and the reducing gas at a predetermined flow rate (e.g., 500 sccm to 8,000 sccm) is supplied from the reducing gas supply source 54a to the gas supply line 54b. Further, in the film forming system 100, in the cycle step cs1, the purge gas respectively stored in the storage tanks 52d and 56d is supplied into the processing container 1 for a predetermined time (e.g., 0.05 second to 5 second). Further, in the film forming system 100, in the cycle step cs1, the precursor and the reducing gas are supplied from the precursor supply source 51a and the reducing gas supply source 55a to the gas supply lines 51b and 55b, respectively. At this time, since the valves 51e and 55e are closed, the precursor and the reducing gas are stored in the storage tanks 51d and 55d, respectively, and the inner pressure of the storage tanks 51d and 55d is increased.

Subsequently, in the film forming system 100, in a cycle step cs2, the valve 51e is opened, and the precursor stored in the storage tank 51d is supplied into the processing container 1 and is adsorbed on the surface of the wafer W. Further, in the film forming system 100, in the cycle step cs2, in parallel with the supply of the precursor into the processing container 1, the purge gas ($N_2$ gas) is supplied from the $N_2$ gas supply sources 52a and 56a to the gas supply lines 52b and 56b, respectively. At this time, since the valves 52e and 56e are closed, the purge gas is stored in the storage tanks 52d and 56d, and the inner pressure of the storage tanks 52d and 56d is increased.

After elapsing a predetermined time (e.g., 0.05 second to 5 second) after the valve 51e is opened, in the film forming system 100, in a cycle step cs3, the valve 51e is closed and the valves 52e and 56e are opened. Therefore, in the film forming system 100, the supply of the precursor into the processing container 1 is stopped, and the purge gas respectively stored in the storage tanks 52d and 56d is supplied into the processing container 1. At this time, since the purge gas is supplied from the storage tanks 52d and 56d in a state where the pressure is increased, the purge gas is supplied into the processing container 1 at a relatively large flow rate, for example, a flow rate (e.g., 500 sccm to 10,000 sccm) larger than the flow rate of the carrier gas. As a result, the precursor remaining in the processing container 1 is quickly discharged to the exhaust pipe 41, and the inside of the processing container 1 is replaced with the atmosphere containing the reducing gas and the $N_2$ gas from the precursor atmosphere in a short time. Meanwhile, since the valve 51e is closed, the precursor supplied from the precursor supply source 51a to the gas supply line 51b is stored in the storage tank 51d, and the inner pressure of the storage tank 51d is increased.

After elapsing a predetermined time (e.g., 0.05 second to 5 second) after the valves 52e and 56e are opened, in the film forming system 100, in a cycle step cs4, the valves 52e and 56e are closed and the valve 55e is opened. Therefore, in the film forming system 100, the supply of the purge gas into the processing container 1 is stopped, and the reducing gas stored in the storage tanks 55d is supplied into the processing container 1 to reduce the precursor adsorbed on the surface of the wafer W. At this time, since the valves 52e and 56e are closed, the purge gas respectively supplied from the $N_2$ gas supply sources 52a and 56a to the gas supply lines 52b and 56b is stored in the storage tanks 52d and 56d, and the inner pressure of the storage tanks 52d and 56d is increased.

After elapsing a predetermined time (e.g., 0.05 second to 5 second) after the valve 55e is opened, in the film forming system 100, in a cycle step cs5, the valve 55e is closed and the valves 52e and 56e are opened. Therefore, in the film forming system 100, the supply of the reducing gas into the processing container 1 is stopped, and the purge gas respectively stored in the storage tanks 52d and 56d is supplied into the processing container 1. At this time, since the purge gas is supplied from the storage tanks 52d and 56d in a state where the pressure is increased, the purge gas is supplied into the processing container at a relatively large flow rate, for example, a flow rate (e.g., 500 sccm to 10,000 sccm) larger than the flow rate of the carrier gas. As a result, the reducing gas remaining in the processing container 1 is quickly discharged to the exhaust pipe 41, and the inside of the processing container 1 is replaced with the atmosphere containing the reducing gas and the $N_2$ gas from the reducing gas atmosphere in a short time. Meanwhile, since the valve 55e is closed, the reducing gas supplied from the reducing gas supply source 55a to the gas supply line 55b is stored in the storage tank 55d, and the inner pressure of the storage tank 55d is increased.

When a predetermined time (e.g., 0.05 second to 5 second) elapses after opening the valves 52e and 56e, in the film forming system 100, the cycle step returns to the cycle step cs1 again. Then, in the film forming system 100, the cycle steps cs1 to cs5 are repeated a predetermined number of times, and then, the ALD cycle is switched to the next ALD cycle ("ALD cycle 2" (reference numeral 232)). As described above, in the film forming system 100, the film forming process by the ALD method is executed such that the processing gas at a defined flow rate is supplied in each cycle step (cs), while controlling the opening and closing of the valves 51e, 55e, 52e, and 56e at a high speed.

(Hardware Configuration of Controller)

Figure 3:
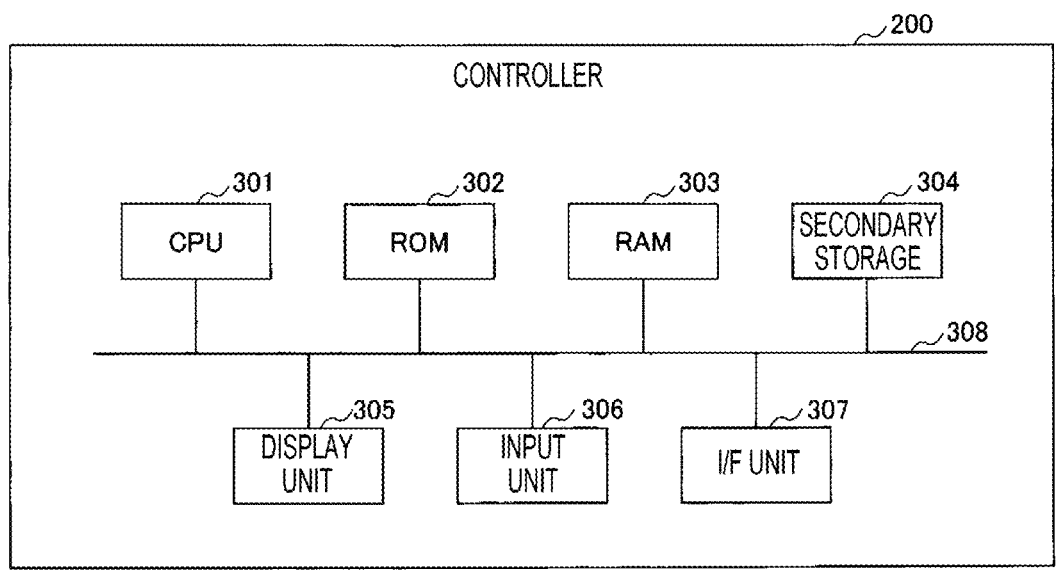
FIG. 3 is a view illustrating an example of a hardware configuration of the controller of the pressure control device.

Next, descriptions will be made on a hardware configuration of the controller 200 of the pressure control device 42_1. FIG. 3 is a view illustrating an example of the hardware configuration of the controller of the pressure control device. As illustrated in FIG. 3, the controller 200 includes a central processing unit (CPU) 301, a read only memory (ROM) 302, and a random access memory (RAM) 303. The CPU 301, the ROM 302, and the RAM 303 constitute a so-called computer.

Further, the controller 200 includes a secondary storage unit 304, a display unit 305, an input unit 306, and an interface (I/F) unit 307. Respective hardwares of the controller 200 are connected with each other via a bus 308.

The CPU 301 is a device that executes various programs (e.g., the pressure control program described above or the like) installed in the secondary storage unit 304. The ROM 302 is a non-volatile memory. The ROM 302 functions as a main memory device that stores, for example, various programs or data required for the CPU 301 to execute the various programs installed in the secondary storage unit 304. Specifically, the ROM 302 stores a boot program such as a basic input/output system (BIOS) or an extensible firmware interface (EFI).

The RAM 303 is a volatile memory such as a dynamic random access memory (DRAM) or a static random access memory (SRAM). The RAM 303 functions as a main storage device that provides a working area developed when the various programs installed in the secondary storage unit 304 are executed by the CPU 301.

The secondary storage unit 304 is a secondary storage device that stores various programs or information used when executing the various programs. A data storage unit (to be described later) is implemented in the secondary storage unit 304.

The display unit 305 is a display device that displays an inner state (e.g., information indicating that an abnormality of the pressure data is detected) of the controller 200. The input unit 306 is an input device configured to input various instructions to the controller 200 by an operator.

The I/F unit 307 is a connecting device configured to be connected to, for example, the operation terminal (e.g., a pressure control valve) included in the pressure control device 42_1 or the pressure sensor.

(Details of Functional Configuration of Abnormality Detecting Unit)

Figure 4:
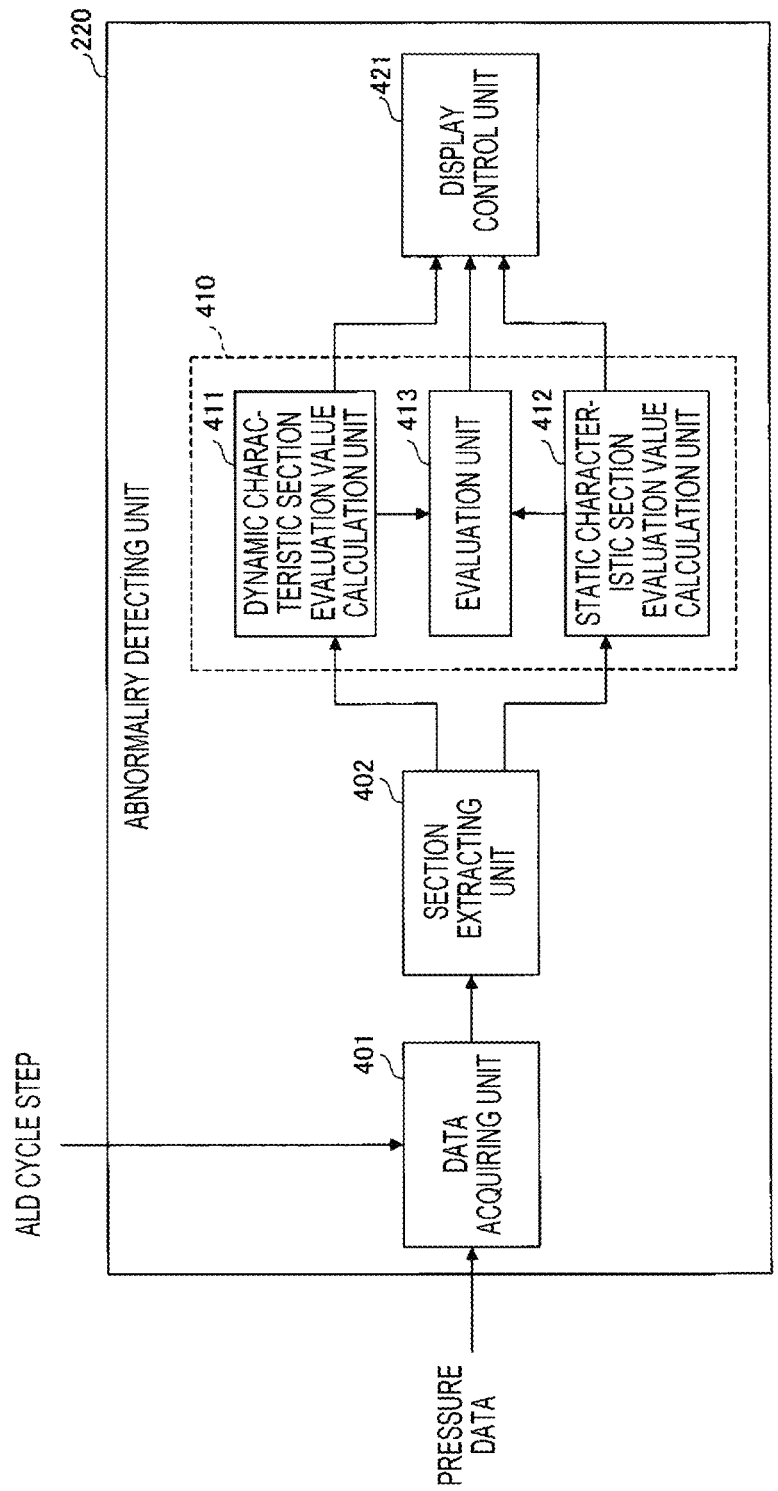
FIG. 4 is a view illustrating an example of details of a functional configuration of an abnormality detecting unit.

Next, descriptions will be made on details of a functional configuration of the abnormality detecting unit 220. FIG. 4 is a view illustrating an example of the details of the functional configuration of the abnormality detecting unit. As illustrated in FIG. 4, the abnormality detecting unit 220 includes a data acquiring unit 401, a section extracting unit 402, a monitoring unit 410, and a display control unit 421. Further, the display unit 410 includes a dynamic characteristic section evaluation value calculating unit 411, a static characteristic section evaluation value calculating unit 412, and an evaluating unit 413.

The data acquiring unit 401 is an example of an acquiring unit, and acquires the pressure data measured by the pressure sensor included in the pressure control device 42_1 via the I/F unit 307. Further, the data acquiring unit 401 extracts the acquired pressure data in a cycle step unit based on each cycle step included in the ALD cycle in the recipe 230 notified from the pressure control unit 210, and notifies the section extracting unit 402.

The section extracting unit 402 is an example of an extracting unit, and processes the pressure data notified in the cycle step unit, and divides each cycle step into a dynamic characteristic section (a first section) in which the pressure data fluctuates and a static characteristic section (a second section) in which the fluctuation of the pressure data is converged.

Specifically, firstly, the section extracting unit 402 calculates the standard deviation of the pressure data in the cycle step sequentially from the start point of the cycle step to the end point of the cycle step by a predetermined time length.

Subsequently, the section extracting unit 402 specifies a position having a standard deviation satisfying predetermined conditions as a stable start point among the standard deviations calculated at the respective positions from the start point of the cycle step to the end point of the cycle step. The predetermined conditions mentioned here include, for example, Being below a predetermined threshold,
Continued for a predetermined time length, and
Being the first standard deviation that satisfies the above two points.

Subsequently, the section extracting unit 402 determines a position where a predetermined time length elapses from the stable start point as a boundary (referred to as a stable point) between the dynamic characteristic section and the static characteristic section.

The section extracting unit 402 determines, from the start point of the cycle step toward the end point of the cycle step, the section before the stable point as the dynamic characteristic section, and the section after the stable point as the static characteristic section.

The section extracting unit 402 notifies the dynamic characteristic section evaluation value calculating unit 411 of the pressure data (first data) belonging to the dynamic characteristic section among the pressure data in the cycle step, and the stable start point. Further, the section extracting unit 402 notifies the static characteristic section evaluation value calculating unit 412 of the pressure data (second data) belonging to the static characteristic section among the pressure data in the cycle step.

The dynamic characteristic section evaluation value calculating unit 411 statistically processes the pressure data belonging to the dynamic characteristic section notified from the section extracting unit 402. Specifically, the dynamic characteristic section evaluation value calculating unit 411 calculates a difference between the pressure data belonging to the dynamic characteristic section and the target gas pressure, and calculates A minimum value of the difference,
A maximum value of the difference,
A difference at the stable start point, and
A time length from the start point of the cycle step to the stable start point (these are referred to as dynamic characteristic section evaluation values that evaluate the pressure data belonging to the dynamic characteristic section).

Further, the dynamic characteristic section evaluation value calculating unit 411 notifies the evaluating unit 413 of the calculated dynamic characteristic section evaluation values.

The static characteristic section evaluation value calculating unit 412 statistically processes the pressure data belonging to the static characteristic section notified from the section extracting unit 402. Specifically, the static characteristic section evaluation value calculating unit 412 calculates a difference between the pressure data belonging to the static characteristic section and the target gas pressure, and calculates A maximum value of the difference,
A minimum value of the difference,
An average value of the difference, and
A standard deviation of the difference (these are referred to as static characteristic section evaluation values that evaluate the pressure data belonging to the static characteristic section).

Further, the static characteristic section evaluation value calculating unit 412 notifies the evaluating unit 413 of the calculated static characteristic section evaluation values.

The evaluating unit 413 evaluates the dynamic characteristic section evaluation values notified from the dynamic characteristic section evaluation value calculating unit 411. As parameters for evaluating the dynamic characteristic section evaluation values, the evaluating unit 413 includes Upper and lower limit values that evaluate whether the minimum value of the difference is normal or abnormal,
Upper and lower limit values that evaluate whether the maximum value of the difference is normal or abnormal,
Upper and lower limit values that evaluate whether the difference at the stable start point is normal or abnormal, and
Upper and lower limit values that evaluate whether the time length from the start point of the cycle step to the stable start point is normal or abnormal. The evaluating unit 413 evaluates the dynamic characteristic section evaluation value using the corresponding upper and lower limit values, and notifies the display control unit 421 when it is determined that the pressure data is abnormal.

Further, the evaluating unit 413 evaluates the static characteristic section evaluation values notified from the static characteristic section evaluation value calculating unit 412. As parameters for evaluating the static characteristic section evaluation values, the evaluating unit 413 includes Upper and lower limit values that evaluate whether the maximum value of the difference is normal or abnormal,
Upper and lower limit values that evaluate whether the minimum value of the difference is normal or abnormal,
Upper and lower limit values that evaluate whether the average value of the difference is normal or abnormal, and
Upper and lower limit values that evaluate whether the standard deviation of the difference is normal or abnormal. The evaluating unit 413 evaluates the static characteristic section evaluation value using the corresponding upper and lower limit values, and notifies the display control unit 421 when it is determined that the pressure data is abnormal.

The display control unit 421 displays information indicating that an abnormality of the pressure data is detected in the cycle step on the display unit 305, when receiving a notification that the pressure data is abnormal from the evaluating unit 413. The display control unit 421 displays information indicating that an abnormality of the pressure data is detected in real time during the execution of the ALD cycle in which the control unit 6 forms a film on the wafer W based on the recipe 230. However, the display control unit 421 may display information indicating that an abnormality of the pressure data is detected after completing the execution for all the ALD cycles in which the control unit 6 forms a film on the wafer W based on the recipe 230.

(Specific Example of Abnormality Detecting Processing by Abnormality Detecting Unit)

Figure 5A:
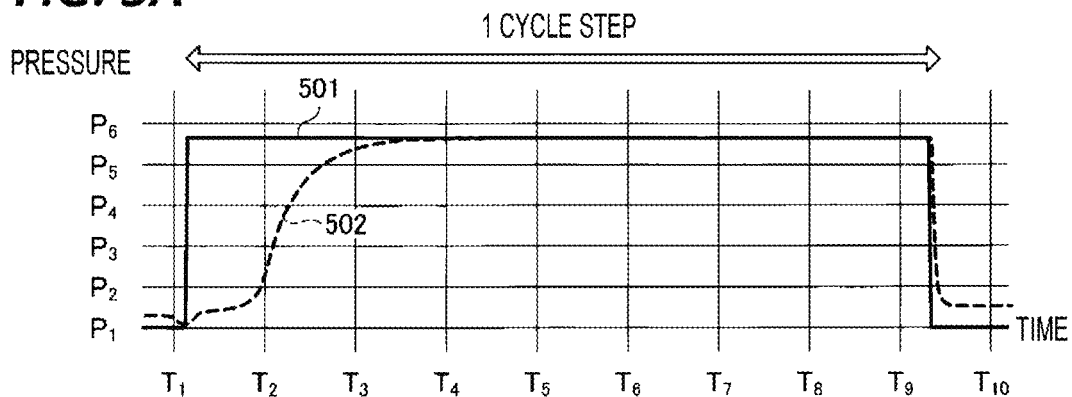
FIGS. 5A to 5C are first drawings illustrating a specific example of an abnormality detecting processing by the abnormality detecting unit.
Figure 5B:
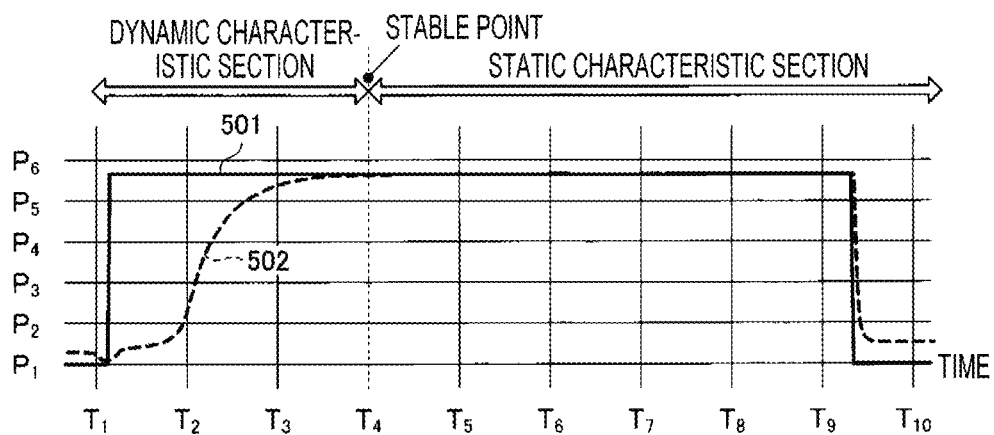
Figure 5C:
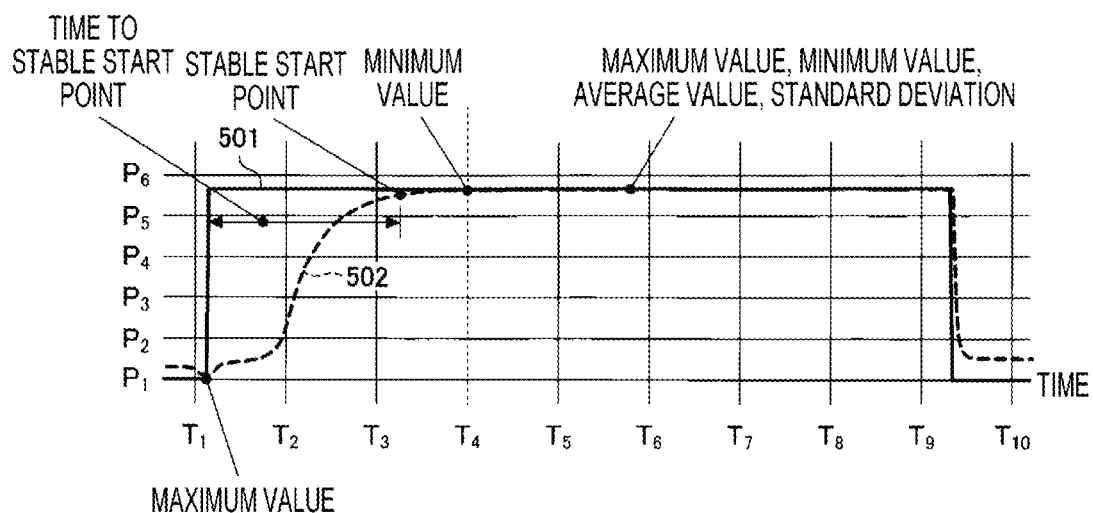

Next, descriptions will be made on a specific example of an abnormality detecting processing by the abnormality detecting unit 220. FIGS. 5A to 5C are first drawings illustrating the specific example of the abnormality detecting processing by the abnormality detecting unit.

In the drawings, FIG. 5A illustrates an example of pressure data for one cycle step extracted by the data acquiring unit 401, and the horizontal axis represents time and the vertical axis represents pressure. Further, the reference numeral 501 indicates the target gas pressure in the cycle step, and the reference numeral 502 indicates the pressure data measured in the cycle step.

Further, FIG. 5B illustrates a state in which the cycle step illustrated in FIG. 5A is divided into the dynamic characteristic section and the static characteristic section by the section extracting unit 402. Time=$T_4$ indicates the stable point in the cycle step.

Further, FIG. 5C illustrates the dynamic characteristic section evaluation value calculated by the dynamic characteristic section evaluation value calculating unit 411, and the static characteristic section evaluation value calculated by the static characteristic section evaluation value calculating unit 412. As illustrated in FIG. 5C, in the case of the example of the reference numeral 502, the maximum value of the difference between the pressure data belonging to the dynamic characteristic section and the target gas pressure is calculated by the difference between the pressure data at the start point position in the dynamic characteristic section and the target gas pressure. Further, the minimum value of the difference between the pressure data belonging to the dynamic characteristic section and the target gas pressure is calculated by the difference between the pressure data at the stable point and the target gas pressure. Further, in the case of the example of the reference numeral 502, the maximum value, the minimum value, and the average value of the difference between the pressure data belonging to the static characteristic section and the target gas pressure has substantially the same value (the standard deviation of the difference is substantially zero).

(Flow of Abnormality Detecting Processing)

Next, descriptions will be made on a flow of the abnormality detecting processing by the abnormality detecting unit 220. FIG. 6 is a first flow chart illustrating the flow of the abnormality detecting processing by the abnormality detecting unit.

In step S601, the data acquiring unit 401 determines whether the control unit 6 is executing a plurality of ALD cycles included in the recipe 230.

In step S601, when it is determined that the plurality of ALD cycles included in the recipe 230 are not being executed (No in step S601), the processing proceeds to step S609. Meanwhile, in step S601, when it is determined that the plurality of ALD cycles included in the recipe 230 are being executed (Yes in step S601), the processing proceeds to step S602.

In step S602, the data acquiring unit 401 determines whether the control unit 6 is processing the cycle step (e.g., the cycle steps cs3 and cs5) of exhausting the processing gas among the plurality of ALD cycles included in the recipe 230.

In step S602, when it is determined that the control unit 6 is not processing the cycle step of exhausting the processing gas (No in step S602), the processing returns to step S601. Meanwhile, in step S602, when it is determined that the cycle step (e.g., the cycle steps cs3 and cs5) of exhausting the processing gas is being executed (Yes in step S602), the processing proceeds to step S603.

In step S603, the data acquiring unit 401 acquires the pressure data included in the cycle step currently being processed by the control unit 6, and notifies the section extracting unit 402 in the cycle step unit.

In step S604, the section extracting unit 402 processes the pressure data notified from the data acquiring unit 401 in the cycle step unit, and divides the cycle step currently being processed into the dynamic characteristic section and the static characteristic section.

In step S605, the dynamic characteristic section evaluation value calculating unit 411 statically processes the pressure data belonging to the dynamic characteristic section and calculates the dynamic characteristic section evaluation value.

In step S606, the static characteristic section evaluation value calculating unit 412 statically processes the pressure data belonging to the static characteristic section and calculates the static characteristic section evaluation value.

In step S607, the evaluating unit 413 determines whether the calculated dynamic characteristic section evaluation value is included within predetermined upper and lower limit values, and further, the calculated static characteristic section evaluation value is included within predetermined upper and lower limit values.

In step S607, when it is determined that the dynamic characteristic section evaluation value is included within the predetermined upper and lower limit values, and further, the static characteristic section evaluation value is included within the predetermined upper and lower limit values (Yes in step S607), the processing proceeds to step S609.

Meanwhile, in step S607, when it is determined that the dynamic characteristic section evaluation value is not included within the predetermined upper and lower limit values, or alternatively, the static characteristic section evaluation value is not included within the predetermined upper and lower limit values (No in step S607), the processing proceeds to step S608.

In step S608, the evaluating unit 413 determines that the pressure data is abnormal and notifies the display control unit 421. The display control unit 421 notifies an operator by displaying information indicating that an abnormality of the pressure data is detected in the cycle step.

In step S609, the data acquiring unit 401 determines whether to end the abnormality detecting processing. In step S609, when it is determined that the abnormality detecting processing is continued (No in step S609), the processing returns to step S601. Meanwhile, in step S609, when it is determined that the abnormality detecting processing is to be ended (Yes in step S609), the abnormality detecting processing is ended.

(Effect of Abnormality Detecting Processing by Abnormality Detecting Unit)

Figure 7A:
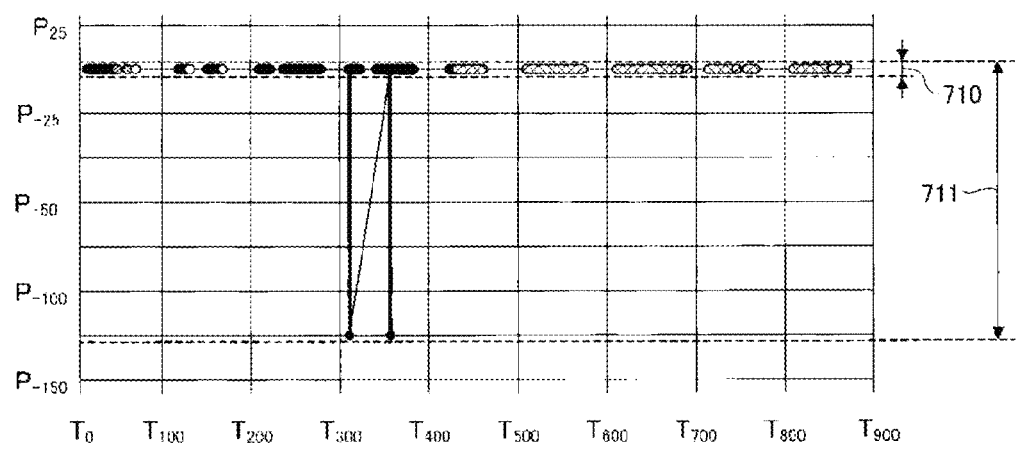
FIGS. 7A and 7B are views for explaining an effect of the abnormality detecting processing by the abnormality detecting unit.
Figure 7B:
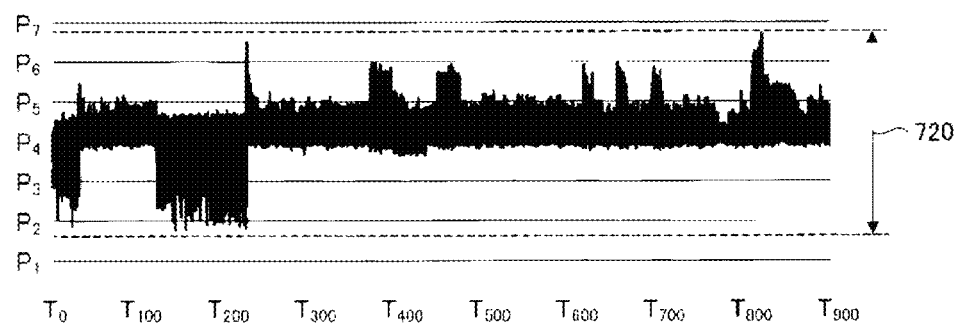

Next, descriptions will be made on an effect of the abnormality detecting processing by the abnormality detecting unit 220. FIGS. 7A and 7B are views for explaining the effect of the abnormality detecting processing by the abnormality detecting unit.

Among the drawings, FIG. 7A illustrates an example of an abnormality detecting processing by an abnormality detecting unit of a comparative example. In a case of the abnormality detecting unit of the comparative example, it is configured that, when processing the pressure data in the cycle step unit, instead of dividing into the dynamic characteristic section and the static characteristic section, the average value of the difference between the pressure data and the target gas pressure is calculated as the evaluation value. In FIG. 7A, the horizontal axis represents time, and the vertical axis represents pressure.

As illustrated in FIG. 7A, when calculating the average value of the difference between the pressure data and the target gas pressure in the cycle step unit without dividing into the dynamic characteristic section and the static characteristic section, the fluctuation range of the average value between the cycle steps becomes large. It is because the gas pressure is controlled under different control conditions for each cycle step, for example, Difference in the target gas pressure,
Difference in fluctuation ranges (a difference from the target gas pressure in the immediately preceding cycle step) of the target gas pressure, or
Difference in the flow rate of the processing gas supplied to the processing container 1. When the gas pressure is controlled under the different control conditions for each cycle step, the behavior until the pressure data converges to the target gas pressure becomes greatly different for each cycle step. As a result, as illustrated in FIG. 7A, the fluctuation range of the average value calculated in the cycle step unit becomes large.

As described above, when the fluctuation range of the evaluation value is large, the upper and lower limit values for detecting the abnormality are set based on the pressure range indicated by an arrow 711, and thus, the abnormality buried in the pressure range indicated by an arrow 710 may not be detected. On the contrary, when the upper and lower limit values for detecting the abnormality are set based on the pressure range indicated by an arrow 710 even when the fluctuation range of the evaluation value is large, the normal pressure data may be detected as an abnormal pressure data.

Meanwhile, when the abnormality detecting unit 220 processes the pressure data in the cycle step unit, the cycle step is divided into the dynamic characteristic section and the static characteristic section, and the result obtained by calculating the average value of the difference between the pressure data belonging to the static characteristic section and the target gas pressure is illustrated in FIG. 7B. In FIG. 7B, the horizontal axis represents time, and the vertical axis represents pressure. However, the range of the vertical axis in FIG. 7B is about 1/10 of that of the vertical axis in FIG. 7A. The pressure range in FIG. 7A indicated by the arrow 710 and the pressure range in FIG. 7B indicated by an arrow 720 represent substantially the same pressure range.

As illustrated in FIG. 7B, when dividing the cycle step into the dynamic characteristic section and the static characteristic section, and calculating the average value of the difference between the pressure data belonging to the static characteristic section and the target gas pressure, the fluctuation range of the average value between the cycle steps becomes small. As a result, it is possible to set the upper and lower limit values for detecting the abnormality based on the pressure range indicated by the arrow 720, and the abnormality buried in the pressure range indicated by the arrow 720 may be accurately detected.

That is, even when the behavior of the pressure data in each cycle step is largely different from each other, the abnormality of the pressure data may be accurately detected with the abnormality detecting unit 220.

(Summary)

As can be clearly seen from the above description, the film forming system 100 according to the first embodiment:

In the film forming process by the ALD method, acquires the pressure data for each cycle step when each cycle step is executed under different control conditions;

Based on the pressure data acquired for each cycle step, divides each cycle step into the dynamic characteristic section and the static characteristic section, and extracts the pressure data belonging to the dynamic characteristic section and the pressure data belonging to the static characteristic section; and Monitors the pressure data by comparing one or both of the dynamic characteristic section evaluation value that evaluates the pressure data belonging to the dynamic characteristic section and the static characteristic section evaluation value that evaluates the pressure data belonging to the static characteristic section with the corresponding upper and lower limit values.

As described above, it is possible to reduce the fluctuation range of the evaluation value by dividing the pressure data into the dynamic characteristic section and the static characteristic section, as compared with the case where the dynamic characteristic section and the static characteristic section are not divided. Therefore, it is possible to monitor the pressure data based on the upper and lower limit values according to the fluctuation range.

As a result, according to the first embodiment, even when the behavior of the pressure data is different in each cycle step as in the film forming process by the ALD method, it is possible to accurately detect the abnormality of the pressure data.

Second Embodiment

In the first embodiment, the section extracting unit 402 processes the pressure data notified in the cycle step unit, and each cycle step is divided into the dynamic characteristic section and the static characteristic section. However, the pressure data notified in the cycle step unit includes pressure data that does not converge to the target gas pressure within the cycle step, and the section extracting unit 402 may not divide the cycle step into the dynamic characteristic section and the static characteristic section. In this case, the dynamic characteristic section evaluation value calculating unit 411 and the static characteristic section evaluation value calculating unit 412 may not calculate the dynamic characteristic section evaluation value and the static characteristic section evaluation value.

Therefore, in a second embodiment, when the section extracting unit 402 may not divide the cycle step into the dynamic characteristic section and the static characteristic section, the dynamic characteristic section evaluation value calculating unit 411 calculates an average value of the difference between the pressure data included in a predetermined time range before the end point of the cycle step and the target gas pressure. Then, in the evaluating unit 413, the pressure data in the cycle step is monitored based on the average value calculated by the dynamic characteristic section evaluation value calculating unit 411.

Therefore, according to the second embodiment, it is possible to detect an abnormality of the pressure data even when the pressure data that is not divisible into the dynamic characteristic section and the static characteristic section is included. Hereinafter, descriptions will be made on the second embodiment focusing on the difference from the first embodiment.

(Specific Example of Abnormality Detecting Processing by Abnormality Detecting Unit)

Figure 8A:
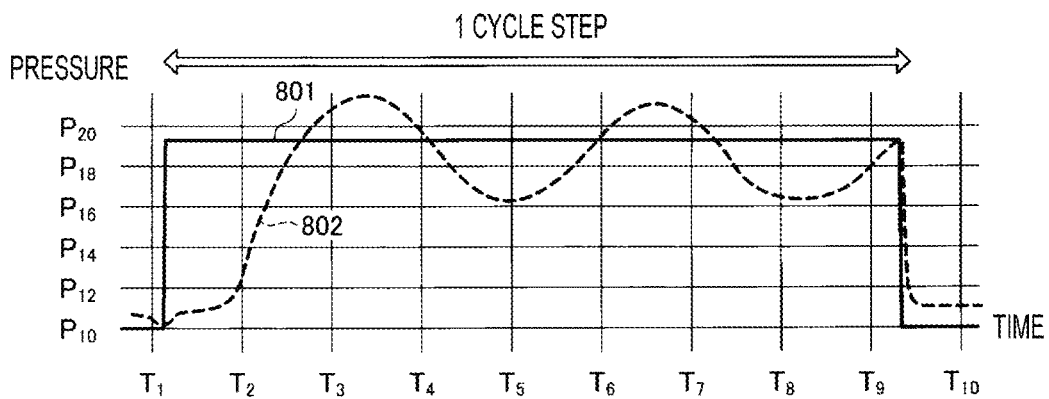
FIGS. 8A to 8C are second drawings illustrating a specific example of the abnormality detecting processing by the abnormality detecting unit.
Figure 8B:
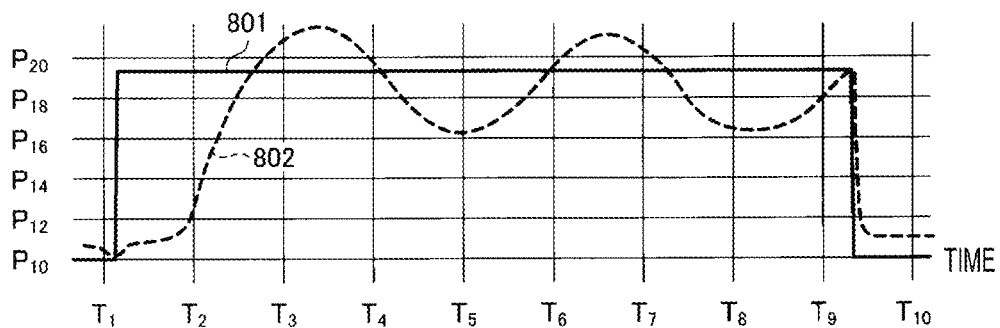
Figure 8C:
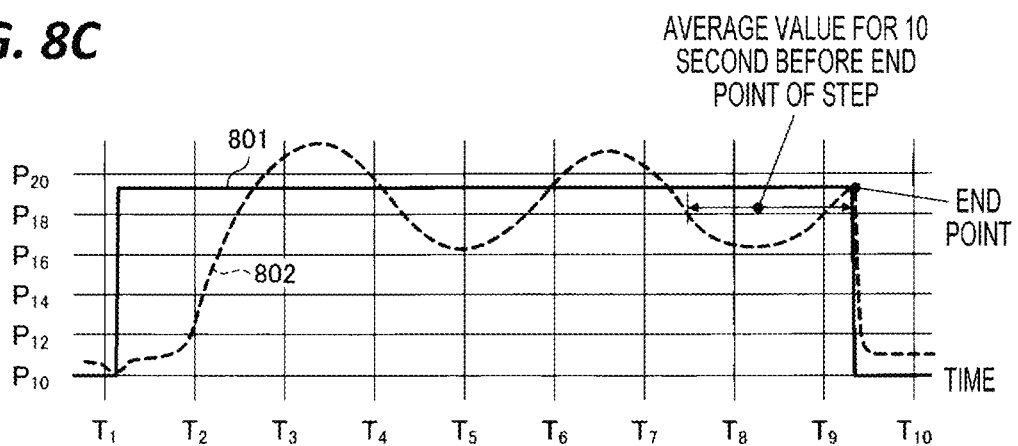

First, descriptions will be made on a specific example of an abnormality detecting processing by the abnormality detecting unit 220 according to the second embodiment. FIGS. 8A to 8C are second drawings illustrating the specific example of the abnormality detecting processing by the abnormality detecting unit.

In the case of FIG. 8A, the difference from FIGS. 5A to 5C is that the pressure data indicated by reference numeral 802 does not converge to the target gas pressure indicated by reference numeral 801 within one cycle step. Further, in the case of FIG. 8B, the difference is that one cycle step is not divisible into the dynamic characteristic section and the static characteristic section. Further, in the case of FIG. 8C, the difference is that the dynamic characteristic section evaluation value and the static characteristic section evaluation value are not calculated, and the average value of the difference between the pressure data included in a predetermined time range (e.g., 10 second) before the end point of the cycle step and the target gas pressure is calculated as the evaluation value.

(Flow of Abnormality Detecting Processing)

Figure 9:
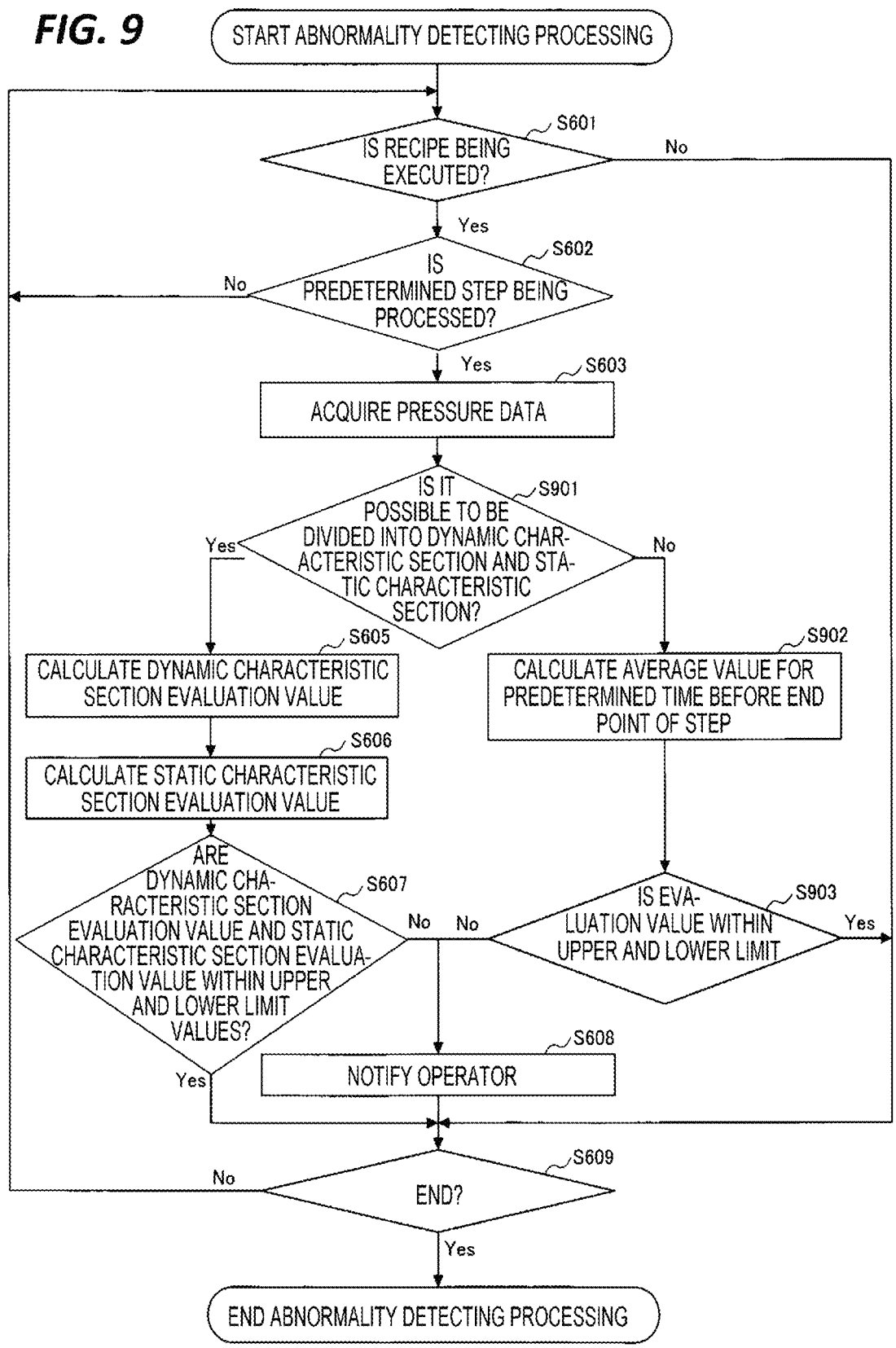
FIG. 9 is a second flow chart illustrating a flow of the abnormality detecting processing by the abnormality detecting unit.

Next, descriptions will be made on a flow of an abnormality detecting processing by the abnormality detecting unit 220 according to the second embodiment. FIG. 9 is a second flow chart illustrating the flow of the abnormality detecting processing by the abnormality detecting unit. The difference from FIG. 6 is step S901 to step S903.

In step S901, the section extracting unit 402 determines whether the cycle step currently being processed is divisible into the dynamic characteristic section and the static characteristic section, based on the pressure data notified from the data acquiring unit 401 in the cycle step unit.

In step S901, when it is determined that the cycle step is divisible into the dynamic characteristic section and the static characteristic section (Yes in step S901), the processing proceeds to step S605. Meanwhile, in step S901, when it is determined that the cycle step is not divisible into the dynamic characteristic section and the static characteristic section (No in step S901), the processing proceeds to step S902.

In step S902, the dynamic characteristic section evaluation value calculating unit 411 calculates the average value of the difference between the pressure data included in a predetermined time range before the end point of the cycle step and the target gas pressure as the evaluation value.

In step S903, the evaluating unit 413 determines whether the calculated evaluation value calculated in step S902 is included within predetermined upper and lower limit values. In step S903, when it is determined that the evaluation value is included within the predetermined upper and lower limit values (Yes in step S903), the processing proceeds to step S609.

Meanwhile, in step S903, when it is determined that the evaluation value is not included within the predetermined upper and lower limit values, the processing proceeds to step S608.

(Summary)

As can be clearly seen from the above description, in addition to the functions described with respect to the first embodiment, the film forming system 100 according to the second embodiment:

Determines whether each cycle step is divisible into the dynamic characteristic section and the static characteristic section, based on the pressure data acquired in the cycle step unit;

When it is determined that the cycle step is not divisible into the dynamic characteristic section and the static characteristic section, calculates the average value of the difference between the pressure data included in a predetermined time range before the end point of the cycle step and the target gas pressure; and Monitors the pressure data by comparing the calculated average value with the upper and lower limit values.

As described above, according to the second embodiment, it is possible to detect an abnormality of the pressure data even when the cycle step is not divisible into the dynamic characteristic section and the static characteristic section.

Third Embodiment

In the second embodiment, the evaluating unit 413 monitors the pressure data by comparing one or both of the dynamic characteristic section evaluation value and the static characteristic section evaluation value with the corresponding upper and lower limit values.

With regard to this, in a third embodiment, firstly, an abnormality of the pressure data is detected by comparing the static characteristic section evaluation value with the corresponding upper and lower limit values. Subsequently, when the abnormality of the pressure data is detected, an operator is prompted to take measures according to the type of the static characteristic section evaluation value exceeding the upper and lower limit values. Subsequently, the dynamic characteristic section evaluation value is compared with the corresponding upper and lower limit values, and when the upper and lower limit values are exceeded, the operator is prompted to take measures according to the type of the dynamic characteristic section evaluation value.

Therefore, the operator may take appropriate measures when information indicating that the abnormality of the pressure data is detected is notified.

Hereinafter, descriptions will be made on the third embodiment focusing on the difference from the second embodiment.

(Flow of Abnormality Detecting Processing)

Figure 10A:
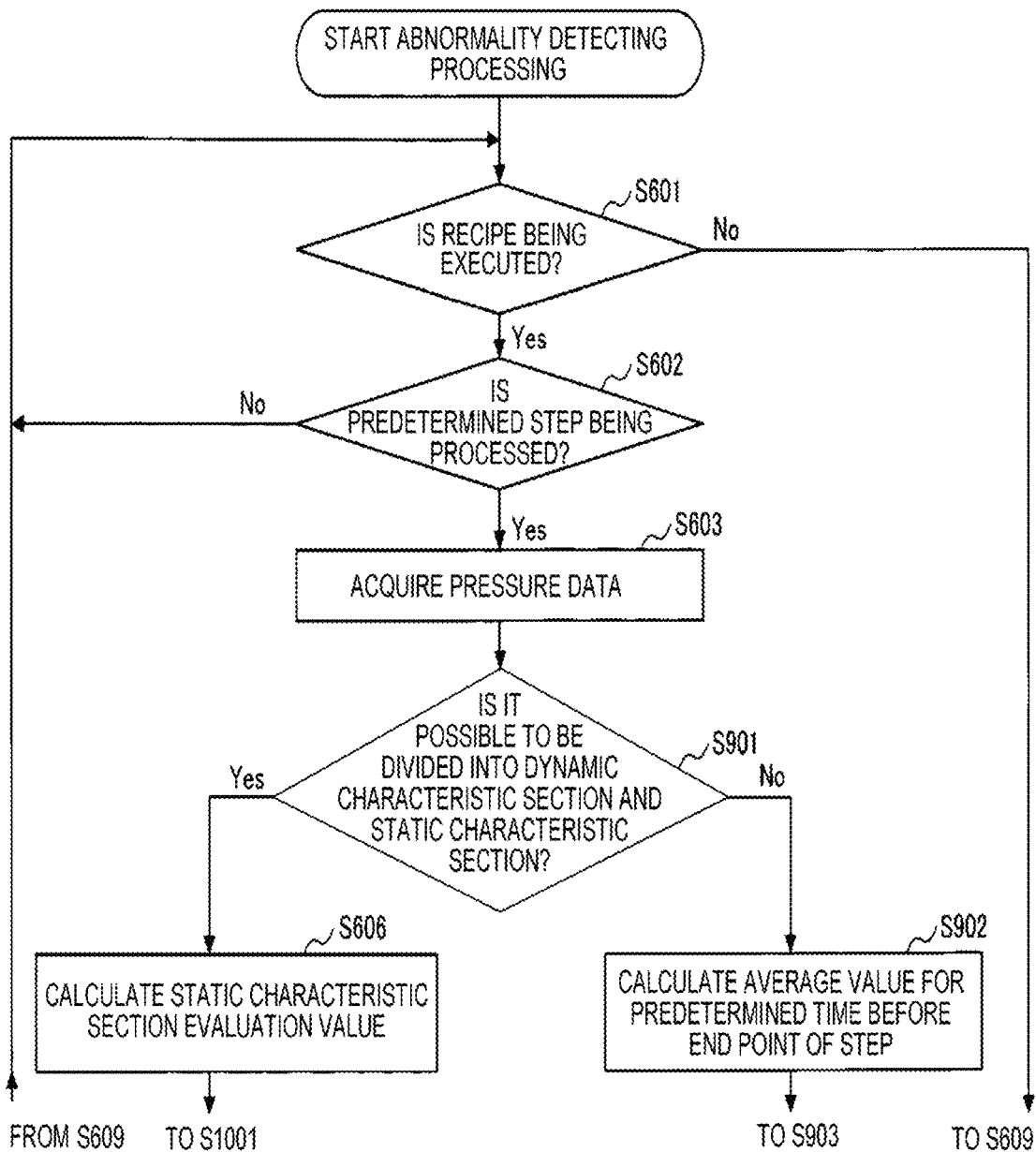
FIGS. 10A and 10B are a third flow chart illustrating a flow of the abnormality detecting processing by the abnormality detecting unit.
Figure 10B:
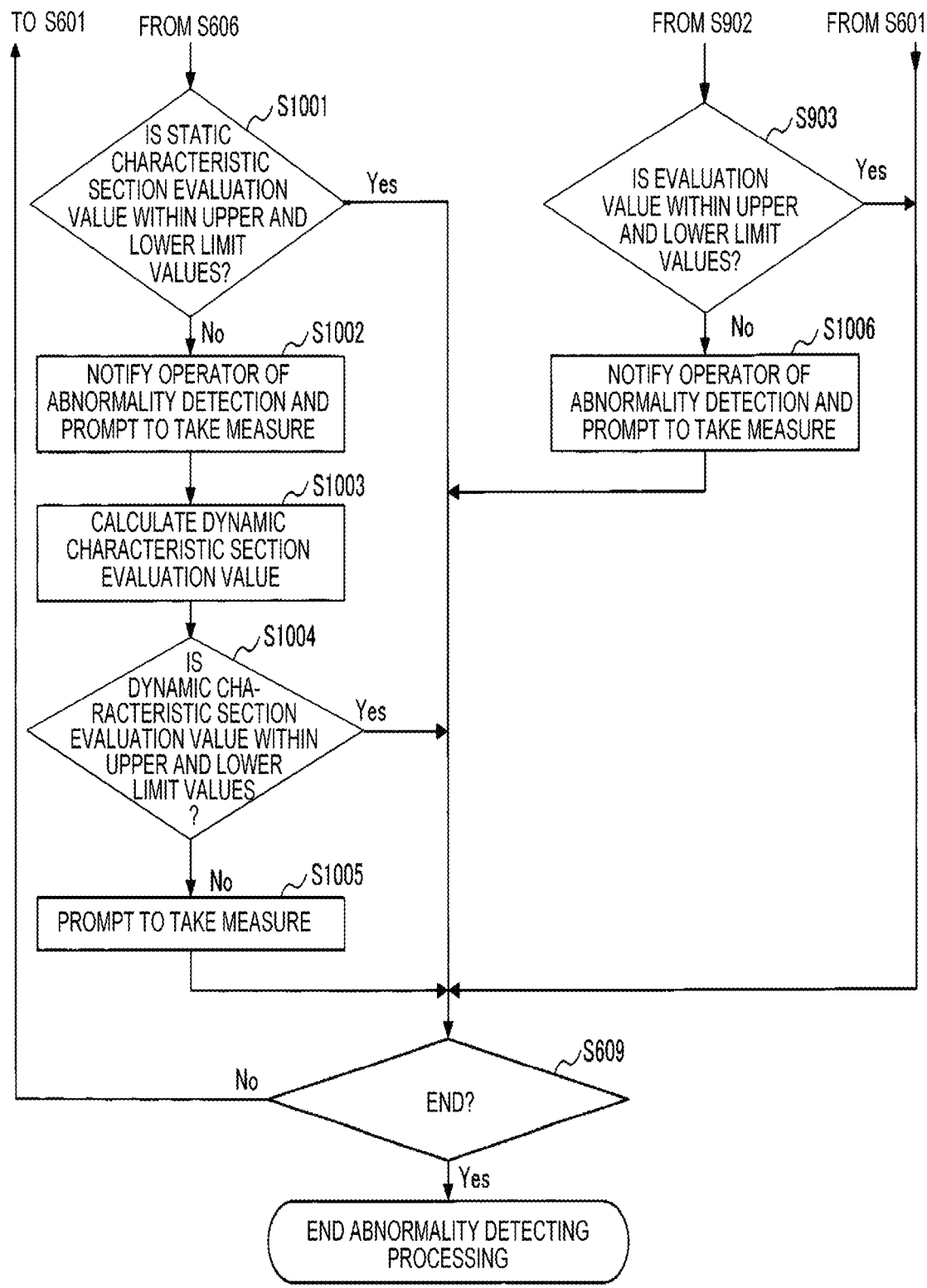

First, descriptions will be made on a flow of an abnormality detecting processing by the abnormality detecting unit 220 according to the third embodiment. FIGS. 10A and 10B are a third flow chart illustrating the flow of the abnormality detecting processing by the abnormality detecting unit. The difference from FIG. 9 is step S1001 to step S1005, and step S1006.

In step S1001, the evaluating unit 413 determines whether the calculated static characteristic section evaluation value is included within predetermined upper and lower limit values.

In step S1001, when it is determined that the static characteristic section evaluation value is included within the predetermined upper and lower limit values (Yes in step S1001), the processing proceeds to step S609.

Meanwhile, in step S1001, when it is determined that the static characteristic section evaluation value is not included within the predetermined upper and lower limit values (No in step S1001), the processing proceeds to step S1002.

In step S1002, the evaluating unit 413 determines that the pressure data is abnormal and notifies the display control unit 421. The display control unit 421 notifies the operator by displaying information indicating that an abnormality of the pressure data is detected in the cycle step. Further, when the average value of the difference among the static characteristic section evaluation values exceeds the upper and lower limit values, the evaluating unit 413 determines that there is an influence on the film thickness, and prompts the operator to confirm the film thickness measurement result.

In step S1003, the dynamic characteristic section evaluation value calculating unit 411 statically processes the pressure data belonging to the dynamic characteristic section and calculates the dynamic characteristic section evaluation value.

In step S1004, the evaluating unit 413 determines whether the calculated dynamic characteristic section evaluation value is included within predetermined upper and lower limit values.

In step S1004, when it is determined that the dynamic characteristic section evaluation value is included within the predetermined upper and lower limit values (Yes in step S1004), the processing proceeds to step S609.

Meanwhile, in step S1004, when it is determined that the dynamic characteristic section evaluation value is not included within the predetermined upper and lower limit values (No in step S1004), the processing proceeds to step S1005.

In step S1005, when the maximum value of the difference among the dynamic characteristic section evaluation values exceeds a predetermined upper limit value, the evaluating unit 413 determines that a large amount of processing gas may be the cause of the abnormality, and prompts the operator to investigate the gas supply system. Further, when the minimum value of the difference among the dynamic characteristic section evaluation values is below a predetermined lower limit value, the evaluating unit 413 determines, as the cause of the abnormality, that the zero point of the pressure sensor is deviated, and prompts the operator to correct the pressure sensor. Further, when the time to the stable start point among the dynamic characteristic section evaluation values exceeds a predetermined upper limit value, the evaluating unit 413 determines that the PID parameter of the pressure control unit 210 is not appropriate, and prompts the operator to correct the PID parameter to reduce the time constant.

In step S1006, the evaluating unit 413 determines that the pressure data in the cycle step is not stabled so that there is an influence on the film thickness, and prompts the operator to confirm the film thickness measurement result.

(Summary)

As can be clearly seen from the above description, in addition to the functions described with respect to the second embodiment, the film forming system 100 according to the third embodiment:

Prompts the operator to take measures according to the type of the static characteristic section evaluation value exceeding the upper and lower limit values;

Prompts the operator to take measures according to the type of the dynamic characteristic section evaluation value exceeding the upper and lower limit values; and Prompts the operator to take measures according to the type of the evaluation value exceeding the upper and lower limit values.

As described above, according to the third embodiment, in addition to notifying the operator of the detection of the abnormality of the pressure data, it is possible to prompt the operator to take appropriate measures.

Other Embodiments

In the third embodiment, when the static characteristic section evaluation value exceeds predetermined upper and lower limit values, the dynamic characteristic section evaluation value is calculated. However, similarly to the first embodiment, the dynamic characteristic section evaluation value may be calculated in parallel with the static characteristic section evaluation value.

Further, in the respective embodiments, as a substrate processing system, the film forming system (a single-sheet type) that executes the film forming process by the ALD method has been described as an example. However, for example, the present disclosure may be also applied, of course, to a film forming system that executes the film forming process by the CVD method. Alternatively, the present disclosure may be also applied, of course, to a substrate processing system that executes a process other than the film forming process. Further, the present disclosure does not limited to the single-sheet type substrate processing system, and may be also applied to the batch type substrate processing system. In this case, the present disclosure may also be applied, of course, to a vertical furnace substrate processing system, and to a horizontal furnace substrate processing system.

Further, in the respective embodiments, as a process data, the pressure data has been described as an example. However, the present disclosure may be also applied, of course, to the process data (e.g., flow rate data, temperature data) other than the pressure data. For example, the flow rate data when the gas supply mechanism 5 supplies the processing gas into the processing container 1 may be used as process data, and an abnormality of the process data may be detected. Alternatively, the temperature data in the processing container 1 may be used as process data, and an abnormality of the process data may be detected.

Further, in the respective embodiments, the film forming process by the ALD method has been described as the film forming process executed by the film forming system 100. However, the film forming system 100 may execute a film forming process other than the film forming process by the ALD method. Alternatively, a substrate processing system other than the film forming system 100 may execute other semiconductor processes.

Further, in the respective embodiments, the abnormality detecting unit 220 is implemented in the controller 200. However, the abnormality detecting unit 220 may be configured to be implemented in an analysis device separated from the controller 200. Alternatively, a part of functions of the abnormality detecting unit 220 may be implemented in the analysis device separated from the controller 200.

According to the present disclosure, it is possible to provide a substrate processing system and a process data monitoring method that accurately detect an abnormality of process data even when a behavior of the process data is different.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system comprising:
a memory; and
a processor coupled to the memory and configured to:
acquire process data of each step included in a predetermined process when each step is executed under different control conditions;
divide each step into a first section where the process data fluctuates and a second section where fluctuation of the process data is converged, and extract first data belonging to the first section and second data belonging to the second section from the process data;
calculate an evaluation value for evaluating the first data based on a difference between a target value of the process data included in the control conditions of each step and the first data and calculate an evaluation value for evaluating the second data based on a difference between the target value and the second data; and
determine an abnormality of the process data by comparing one or both of the evaluation value of the first data and the evaluation value of the second data with corresponding upper and lower limit values.

2. The substrate processing system according to claim 1, wherein the processor calculates a standard deviation by a predetermined time length from a start point to an end point for the process data, and divides each step into the first section and the second section with a position corresponding to a standard deviation that satisfies a predetermined condition among the calculated standard deviations, as a boundary.

3. The substrate processing system according to claim 2, wherein the evaluation value of the first data include a minimum value and a maximum value of the difference between the target value and the first data, the difference between the first data and the target value at a position where the fluctuation of the process data is converged in each step, and a time from the start point in each step to the converged position, and
the evaluation value of the second data includes a maximum value, a minimum value, an average value, and a standard deviation of the difference between the target value and the second data.

4. The substrate processing system according to claim 3, wherein, when one of the evaluation values of the second data exceeds the corresponding upper and lower limit values, the processor determines that the process data is abnormal, and, when determined that the process data is abnormal, compares the evaluation value of the first data with the corresponding upper and lower limit values.

5. The substrate processing system according to claim 4, wherein, when determined that the process data is abnormal, the processor determines an influence due to the abnormality of the process data according to a type of the evaluation value exceeding the upper and lower limit values.

6. The substrate processing system according to claim 4, wherein, when one of the evaluation values of the first data exceeds the corresponding upper and lower limit values, the processor determines a cause of detecting of the abnormality of the process data according to a type of the evaluation value exceeding the upper and lower limit values.

7. The substrate processing system according to claim 2, wherein, when the processor is not able to divide any one step into the first section and the second section, the processor determines the abnormality of the process data by comparing an evaluation value of the process data having a predetermined time length before an end point of the step with corresponding upper and lower limit values.

8. The substrate processing system according to claim 7, wherein, when the evaluation value of the process data exceeds the corresponding upper and lower limit values, the processor determines that the process data is abnormal, and determines an influence due to the abnormality of the process data.

9. A method for monitoring process data, comprising:
acquiring process data of each step included in a predetermined process when each step is executed under different control conditions;
extracting in which each step is divided into a first section where the process data fluctuates and a second section where fluctuation of the process data is converged, and first data belonging to the first section and second data belonging to the second section are extracted from the process data;
calculating an evaluation value for evaluating the first data based on a difference between a target value of the process data included in the control conditions of each step and the first data and calculating an evaluation value for evaluating the second data based on a difference between the target value and the second data; and
determining an abnormality of the process data by comparing one or both of the evaluation value of the first data and the evaluation value of the second data with corresponding upper and lower limit values, by a processor.

* * * * *